United States Patent [19]
Shroff et al.

[11] Patent Number: 6,154,054
[45] Date of Patent: Nov. 28, 2000

[54] PROGRAMMABLE DEVICE HAVING ANTIFUSES WITHOUT PROGRAMMABLE MATERIAL EDGES AND/OR CORNERS UNDERNEATH METAL

[75] Inventors: Mehul D. Shroff, Cupertino; Rajiv Jain, Palo Alto, both of Calif.; Andre Stolmeijer, Washougal, Wash.; Kathryn E. Gordon, Los Altos Hills, Calif.

[73] Assignee: QuickLogic Corporation, Sunnyvale, Calif.

[21] Appl. No.: 09/309,165

[22] Filed: May 10, 1999

Related U.S. Application Data

[62] Division of application No. 09/133,999, Aug. 13, 1998, Pat. No. 5,955,751.

[51] Int. Cl.$^7$ .................................................. H03K 19/177
[52] U.S. Cl. ............................................. 326/41; 326/40
[58] Field of Search ................................ 326/41, 40, 44; 438/129

[56] References Cited

U.S. PATENT DOCUMENTS

| | | |
|---|---|---|
| 4,823,181 | 4/1989 | Mohsen et al. . |
| 4,873,459 | 10/1989 | El Gamal et al. . |
| 4,876,220 | 10/1989 | Mohsen et al. . |
| 4,943,538 | 7/1990 | Mohsen et al. . |
| 5,055,718 | 10/1991 | Galbraith et al. . |
| 5,057,451 | 10/1991 | McCollum . |
| 5,070,384 | 12/1991 | McCollum et al. . |
| 5,087,958 | 2/1992 | Chen et al. . |
| 5,122,685 | 6/1992 | Chan et al. . |
| 5,130,777 | 7/1992 | Galbraith et al. . |
| 5,134,457 | 7/1992 | Hamdy et al. . |
| 5,163,180 | 11/1992 | Eltoukhy et al. . |
| 5,171,715 | 12/1992 | Husher et al. . |

(List continued on next page.)

FOREIGN PATENT DOCUMENTS 2086 654   5/1982   United Kingdom .

OTHER PUBLICATIONS

S. Brown, et al., "Field Programmable Gate Arrays", pp. 1–43 and 88–202 (1992).
Actel FPGA Data Book and Design Guide, pp. ii through 7–8 (1996).
QuickLogic Data Book 1996/97, pp. i through 6–36.
Actel 54SX Family FPGAs, pp. 1 through 35 (Mar. 1998).

Primary Examiner—David Nelms
Assistant Examiner—Thong Le
Attorney, Agent, or Firm—Skjerven Morrill MacPherson

[57] ABSTRACT

A field programmable gate array has antifuses disposed over logic modules. Each of these antifuses includes a conductive plug and an overlaying region of programmable material (for example, amorphous silicon). To program one of these antifuses, an electric connection is formed through the programmable material to couple the conductive plug to a metal conductor that overlays the region of programmable material. The metal conductor includes a layer of a barrier metal to separate another metal of the conductor (for example, aluminum from an aluminum layer) from migrating into the programmable material when the antifuse is unprogrammed. In some embodiments, less than three percent of all antifuses of the field programmable gate array has a corner (from the top-down perspective) of the region of programmable material that is disposed (within lateral distance DIS of the conductive plug) underneath the metal conductor of that antifuse. In some embodiments, less than seventy-five percent of all antifuses of the field programmable gate array have an edge of the region of programmable material disposed (within lateral distance DIS of the conductive plug) underneath the metal conductor of that antifuse. Other antifuse structures and methods are also disclosed for preventing programmable material corners and/or edges from compromising yield and/or reliability of programmable devices.

12 Claims, 5 Drawing Sheets

U.S. PATENT DOCUMENTS

| | | |
|---|---|---|
| 5,196,724 | 3/1993 | Gordon et al. . |
| 5,233,217 | 8/1993 | Dixit et al. . |
| 5,308,795 | 5/1994 | Hawley et al. . |
| 5,362,676 | 11/1994 | Gordon et al. . |
| 5,371,390 | 12/1994 | Mohsen . |
| 5,373,169 | 12/1994 | McCollum et al. . |
| 5,387,812 | 2/1995 | Forouhi et al. . |
| 5,404,029 | 4/1995 | Husher et al. . |
| 5,411,917 | 5/1995 | Forouhi et al. . |
| 5,412,244 | 5/1995 | Hamdy et al. . |
| 5,424,655 | 6/1995 | Chua . |
| 5,449,947 | 9/1995 | Chen et al. . |
| 5,464,790 | 11/1995 | Hawley . |
| 5,495,181 | 2/1996 | Kolze . |
| 5,498,895 | 3/1996 | Chen . |
| 5,502,315 | 3/1996 | Chua et al. . |
| 5,510,646 | 4/1996 | Forouhi et al. . |
| 5,519,248 | 5/1996 | Yan et al. . |
| 5,557,136 | 9/1996 | Gordon et al. . |
| 5,592,016 | 1/1997 | Go et al. . |
| 5,619,063 | 4/1997 | Chen et al. . |
| 5,663,091 | 9/1997 | Yen et al. . |
| 5,670,403 | 9/1997 | Chen . |
| 5,701,027 | 12/1997 | Gordon et al. . |
| 5,753,528 | 5/1998 | Forouhi et al. . |
| 5,763,299 | 6/1998 | McCollum et al. . |
| 5,763,898 | 7/1998 | Forouhi et al. . |
| 5,831,448 | 11/1998 | Kean ......................................... 326/41 |
| 5,858,817 | 1/1999 | Bansal ..................... 438/129 |

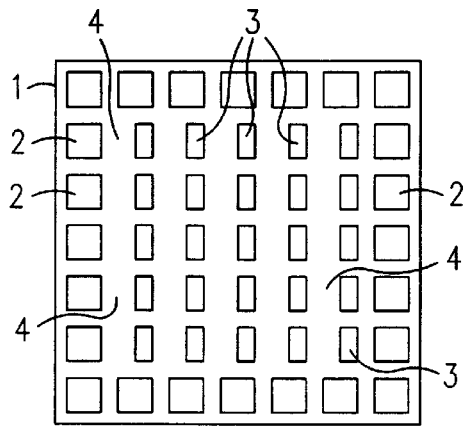
FIG. 1
(PRIOR ART)
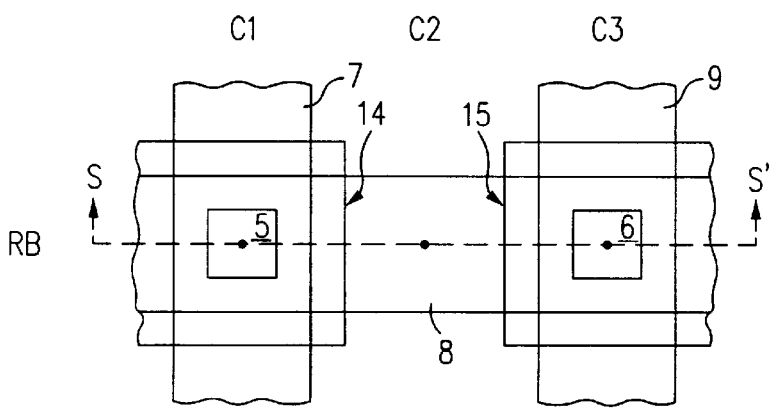
FIG. 2
(PRIOR ART)
FIG. 3
(PRIOR ART)

PROGRAMMABLE DEVICE HAVING ANTIFUSES WITHOUT PROGRAMMABLE MATERIAL EDGES AND/OR CORNERS UNDERNEATH METAL

This application is a division of application Ser. No. 09/133,999 filed Aug. 13, 1998 now U.S. Pat. No. 5,955, 751.

FIELD OF THE INVENTION

This invention relates to programmable integrated circuits (for example, field programmable gate arrays or "FPGAs") employing antifuses.

BACKGROUND AND RELATED PRIOR ART

A field programmable gate array is a versatile integrated circuit chip, the internal circuitry of which may be configured by an individual user to realize a user-specific circuit. To configure a field programmable gate array, the user configures an on-chip interconnect structure of the field programmable gate array so that selected inputs and selected outputs of selected on-chip logic components are connected together in such a way that the resulting circuit is the user-specific circuit desired by the user. For additional background on antifuse-based field programmable gate array structures, the reader is referred to: U.S. Pat. Nos. 5,495,181, 5,424,655, 5,122,685, 5,055,718, 4,873,459, 5,502,315, 5,362,676, 5,557,136, 5,308,795 and 5,233,217; U.S. patent application Ser. No. 08/667,702 now U.S. Pat. No. 5,825,201 issued on Oct. 10, 1998 entitled "ramming Architecture For A Programmable Integrated Circuit Employing Antifuses" by Paige A. Kolze, filed Jun. 21, 1996; the 1996/97 QuickLogic Data Book; the 1996 Actel FPGA Data Book and Design Guide; and the book entitled "Field-Programmable Gate Arrays" by Stephen Brown et al., Kluwer Academic Publishers (1992) (the subject matter of these documents is incorporated herein by reference).

FIG. 1 (Prior Art) is a top-down diagram of a first conventional field programmable gate array 1 (for example, the QL16X24 QuickLogic field programmable gate array in the pASIC1 family). Field programmable gate array (FPGA) 1 includes a plurality of interface cells 2, a plurality of logic modules 3 arranged in rows and columns, and a programmable interconnect structure 4 employing antifuses. The programmable interconnect is disposed in spaces between the rows and columns of logic modules.

FIG. 2 (Prior Art) is a top-down diagram of a matrix of locations. Many of the antifuses of the programmable interconnect structure of FPGA 1 are disposed in such a matrix. The rows of locations are labeled with row designators RA, RB, RC and so forth. The columns of locations are labeled with column designators C1, C2, C3 and so forth. For each column, there is a vertically extending column conductor (not shown) that extends underneath the locations of its column. For each row, there is a horizontally extending row conductor (not shown) that extends underneath the locations of its row. The row conductors extend in a plane over the plane of the column conductors. Antifuses are disposed at the locations illustrated in FIG. 2 where the row conductors cross the column conductors. For example, to couple vertically extending column conductor C3 to horizontally extending row conductor R4, an antifuse disposed at location C3/R4 would be programmed. The lateral distance DIS between respective antifuses in a row and between respective antifuses in a column is the minimum lateral spacing between antifuses on the FPGA. No two antifuses of the FPGA are separated by a lateral distance smaller than lateral distance DIS. In FPGA 1, some of the matrix locations are not populated with antifuses. Some of the conductors are made wider to reduce conductor resistance to speed the propagation of signals through the conductor. Distances greater than distance DIS separate some of the rows and/or columns to accommodate wider conductors.

In this first conventional FPGA: 1) the antifuses are conductive plug-type antifuses (for more details on conductive plug-type antifuses, see the description below); 2) none of the antifuses has an associated programmable material corner under a metal conductor within lateral distance DIS of the conductive plug of the antifuse (for more details on what such a programmable material corner is, see the description below); and 3) approximately 20 percent of the antifuses have programmable material edges under a metal conductor within lateral distance DIS of the conductive plug of the antifuse (for more details on what such a programmable material edge is, see the description below).

FIG. 3 (Prior Art) is a top-down diagram of two antifuses 5 and 6 of a second conventional FPGA (for example, the QL2007 QuickLogic FPGA in the pASIC2 family). To increase packing density in this second conventional FPGA, the spaces between logic modules of the first conventional FPGA are substantially eliminated in the center portion of the integrated circuit and the programmable interconnect structure is disposed in layers above the logic modules. A matrix of antifuses is disposed over each respective logic module. For example, an antifuse 5 is disposed at location RB/C1 and an antifuse 6 is disposed at location RB/C3. There is no antifuse at location RB/C2. An inter-metal layer insulator covers the underlying column conductors and separates the column conductors from the overlaying row conductor. If programmed, antifuse 5 would couple vertically extending column conductor 7 to overlaying horizontally extending row conductor 8. If programmed, antifuse 6 would couple vertically extending column conductor 9 to horizontally extending row conductor 8.

In the second conventional FPGA, the antifuses are also conductive plug-type antifuses. Each conductive plug-type antifuse includes a conductive plug and a layer of a programmable material disposed over the conductive plug between the top of the plug and the bottom of the overlaying row conductor. The conductive plug is disposed in an opening in the inter-metal layer insulator. When programmed, a conductive filament forms through the layer of programmable material to couple the conductive plug to the overlaying row conductor. For additional background information on conductive plug-type antifuse structures and how to make them, see U.S. Pat. Nos. 5,557,136, 5,308,795 and 5,233,217, and the U.S. patent application No. 09/133, 998, now allowed entitled "Metal-to-Metal Antifuse Having Improved Barrier Layer", by Rajiv Jain et al., filed Aug. 13, 1998 (the subject matter of these patents and this patent application is incorporated herein by reference).

FIG. 4 (Prior Art) is a cross-sectional diagram taken along sectional line SS' of FIG. 3. Layer 10 is a layer of insulation (for example, silicon dioxide). The antifuses are disposed in layers above the substrate such that layer 10 insulates the antifuse and programmable interconnect layers from underlying logic module transistors in the substrate. Column conductor 7 and column conductor 9 each includes a bottom barrier layer (for example, TiW or TiN), a relatively thick layer involving aluminum, and a top barrier layer (for example, TiW or TiN). Conductive plugs 5P and 6P of antifuses 5 and 6 are disposed in openings in inter-metal layer insulation 11. The center axis 5PA of conductive plug 5P is located at location RB/C1 and the center axis 6PA of conductive plug 6P is located at location RB/C3. Each conductive plug involves a thin binding layer of titanium and/or TiW or TiN as well as the bulk plug material, which in this case is tungsten. Overlaying the conductive plugs is a layer of the programmable material 12. The layer of programmable material is intrinsic plasma enhance chemical vapor deposited (PECVD) amorphous silicon and is disposed substantially in a plane 12A. Row conductor 8, like column conductors 7 and 9, includes a bottom barrier layer (for example, TiW or TiN), an intervening aluminum layer, and a top barrier layer (for example, TiW or TiN).

The bottom barrier layer of row conductor 8 prevents aluminum from row conductor 8 from migrating into the programmable material 12 and adversely affecting antifuse characteristics. A "programmable material plug overlay design rule" used in generating the layout of the second conventional FPGA ensures that the programmable material covers the top of the conductive plugs and extends in a lateral dimension past the top edges of the conductive plugs by at least a lateral distance 13. Because there is no antifuse disposed at location RB/C2, use of the design rule results in two edges 14 and 15 of the programmable material 12 located at distance 13 from the conductive plugs 5P and 6P, respectively.

FIG. 5 (Prior Art) is a top-down diagram of another antifuse structure in the second conventional FPGA where the programmable interconnect is disposed over the logic modules. Here row conductor 8 is made wider to reduce resistance and to decrease the propagation time of signals down the row conductor. Not only are edges 14 and 15 of the programmable material disposed underneath row conductor 8, but corners 16–19 of the programmable material are now also disposed underneath row conductor 8. In addition to the configurations of FIGS. 3 and 5, there are other antifuse structures of the second conventional FPGA that result in programmable material edges and corners being disposed underneath overlaying metal conductors.

In this second conventional FPGA: 1) approximately 4% of the antifuses have an associated programmable material corner under a metal conductor within lateral distance DIS of the conductive plug; and 2) approximately 90% of the antifuses have an associated programmable material edge under a metal conductor within lateral distance DIS of the conductive plug. Reducing such edges and corners is desired to increase yield and to improve reliability of an FPGA such as the second conventional FPGA where conductive plug-type antifuses are disposed in a layer (or layers) above logic modules.

SUMMARY

It is believed that one failure mechanism of antifuses is associated with the existence of programmable material corners and/or edges underneath overlaying conductors.

In accordance with the present invention, antifuses of the programmable interconnect structure of an FPGA are disposed in layers over logic modules of the FPGA. These antifuses include a conductive plug and an overlaying region of programmable material (for example, amorphous silicon). To program one of these antifuses, an electrical connection is formed through the programmable material to couple the conductive plug to a metal conductor that overlays the region of programmable material. The metal conductor includes a layer of a barrier metal to separate another metal of the conductor (for example, an aluminum layer) from migrating into the programmable material when the antifuse is unprogrammed.

In one embodiment: 1) less than 3% of all the antifuses of the FPGA have a corner (from the top-down perspective) of the region of programmable material (within lateral distance DIS of the conductive plug) underneath the metal conductor of that antifuse; and 2) less than 75% of all the antifuses of the FPGA have an edge of the region of programmable material (within lateral distance DIS of the conductive plug) underneath the metal conductor of that antifuse.

In a preferred embodiment: 1) the FPGA has no antifuse (0%) that has a corner (from the top-down perspective) of the region of programmable material (within lateral distance DIS of the conductive plug) underneath the metal conductor of that antifuse; and 2) less than 5% of all the antifuses of the FPGA have an edge of the region of programmable material (within lateral distance DIS of the conductive plug) underneath the metal conductor of that antifuse.

Other embodiments, structures and methods are also disclosed for improving device yield and reliability. This summary does not purport to define the invention. The invention is defined by the claims.

BRIEF DESCRIPTION OF THE DRAWINGS

FIG. 1 (Prior Art) is a top-down diagram of a conventional FPGA having a programmable interconnect structure employing antifuses.

FIG. 2 (Prior Art) is a top-down diagram of a matrix of locations where antifuses may be located in the programmable interconnect structure of a conventional FPGA.

FIG. 3 (Prior Art) is a top-down diagram of a conventional FPGA structure.

DETAILED DESCRIPTION OF THE PREFERRED EMBODIMENTS

It is believed that antifuse failures are associated with corners of the programmable material of an antifuse being too close to the conductive plug of the antifuse. The conductor in contact with the programmable material of the antifuse has a layer of barrier metal to prevent aluminum from the conductor (or another metal that migrates easily in the programmable material) from penetrating and migrating into the programming material of the antifuse. The corner (a corner when the programmable material is viewed from a top-down perspective) is believed to provide a spot in the barrier metal that is susceptible to failure such that aluminum from the conductor can migrate into the programmable material. This susceptibility may be due to poor step coverage of the barrier metal over the programmable material corner or a weak barrier. In some embodiments, susceptibility to failure may be due to diffusion of the programmable material into overlaying metal as well as or rather than migration of metal from the overlaying metal into the programmable material.

In a preferred embodiment of an FPGA having antifuses disposed above logic modules, no antifuse has a corner of its layer of programmable material disposed underneath a row or column conductor (the programmable material separates the conductive plug from the overlaying row or column conductor) within lateral distance DIS of the center axis of the conductive plug of the antifuse. Lateral distance DIS is the lateral distance between the closest two antifuses of the FPGA measured from the antifuse center axis when viewed from a top-down perspective. In some embodiments there are antifuses with such programmable material corners, but efforts are made to reduce their number. In one embodiment, less than 3% of all the antifuses of an FPGA have such corners.

It is also believed that antifuse failures are associated with programmable material edges being disposed underneath the row or column conductor within lateral distance DIS of the center axis of the antifuse conductive plug. The edge is believed to provide a spot in the barrier metal that is susceptible to failure such that aluminum from the conductor can migrate into the programmable material. Although it may be impossible to eliminate all such edges from the FPGA, the number of antifuses with such edges is reduced in accordance with the invention. Moreover, the length of many of these edges may also be reduced in accordance with the invention. In a preferred embodiment, less than 5% of all the antifuses of an FPGA have such a programmable material edge. In another embodiment, less than 75% of all the antifuses of an FPGA have such a programmable material edge.

Figure 6:
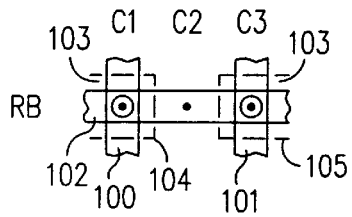

FIG. 6 (Prior Art) is a simplified top-down diagram of a conventional structure (the same structure as shown in FIG. 3). There are two vertically extending column conductors 100 and 101 and one horizontally extending row conductor 102. The row conductor extends over the column conductors. There are antifuses disposed at locations RB/C1 and RB/C3, but there is no antifuse at location RB/C2. The edge of the layer programmable material 103 of the antifuse at location RB/C1 is designated with dashed line 104. The edge of the layer programmable material 103 of the antifuse at location RB/C3 is designated with dashed line 105. The edges of the programmable material 103 extend underneath row conductor 102 between locations RB/C1 and RB/C3. One such edge is within lateral distance DIS of the center axis of the antifuse at location RB/C1 and the other such edge is within lateral distance DIS of the center axis of the antifuse at location RB/C3.

Figure 7A:
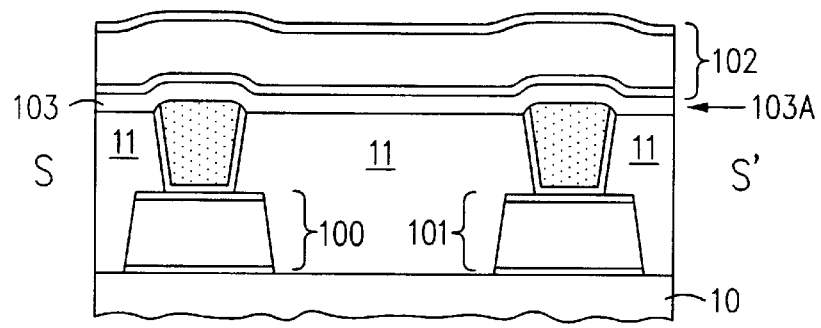
FIG. 7A is a cross-sectional diagram taken along sectional line SS' of the structure of FIG. 7.
Figure 7:
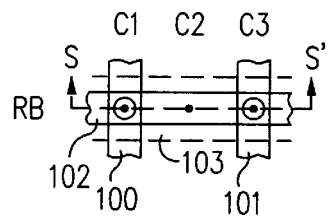
FIGS. 7, 9, 11, 13, 15, 17, 19, 21 and 23 are top-down diagrams of structures in accordance with embodiments of the present invention.

FIG. 7 is a simplified top-down diagram in accordance with an embodiment of the present invention. There is one common layer of programmable material 103 for both antifuses such that there is no edge or corner of the programmable material 103 under row conductor 102 between locations RB/C1 and RB/C3.

Figure 4:
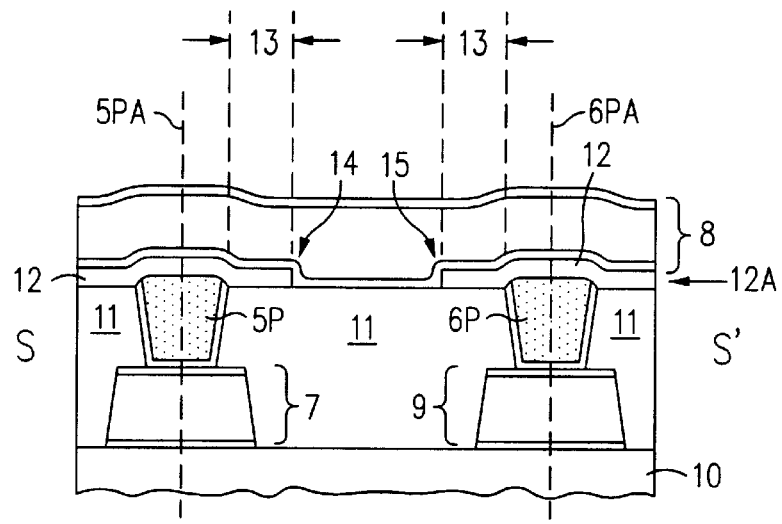
FIG. 4 (Prior Art) is a cross-sectional diagram taken along sectional line SS' of the conventional structure of FIG. 3.
Figure 5:
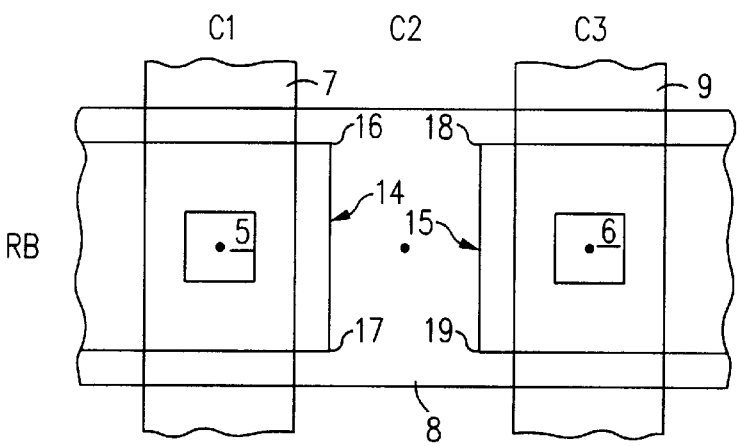
FIGS. 5, 6, 8, 10, 12, 14, 16, 18, 20 and 22 (Prior Art) are top-down diagrams of conventional structures that may be found in a conventional field programmable gate array.

FIG. 7A is a simplified cross-sectional diagram of the structure of FIG. 7. Whereas in the structure of FIG. 4 there are edges 14 and 15 of the programmable material 12 underneath the row conductor 8, in the structure of FIG. 7A there are no such edges. (The term "underneath" here does not mean that the edge is directly under the edge of an overlaying and touching metal layer, rather it means the edge is actually underneath the overlaying metal.) The layer of programmable material 103 is made to extend from location RB/C1 to location RB/C3 underneath row conductor 102. The layer of programmable material 103 is disposed substantially in a plane 103A. As in the structure of FIG. 4, layer 10 is an insulator (for example, oxide) and layer 11 is an inter-metal layer of insulation (for example, oxide).

Although one particular conductive plug-type antifuse structure is illustrated, it is understood that numerous other antifuse structures may be implemented. An inverted conductive plug-type antifuse can be employed where the programmable material is disposed in a plane underneath the conductive plug. A via-type antifuse can also be implemented where the programmable material extends into the opening in the inter-metal layer insulation. The programmable material may involve other materials and/or layers of materials, for example, a layer or layers of polysilicon, silicon nitride and/or silicon oxide. A double barrier layer can be formed by forming a layer of a barrier metal such as TiN over an amorphous silicon layer, etching the amorphous silicon layer and the barrier metal layer at the same time to form the region of the programmable material (with a protective piece of TiN on top of the programmable material), then oxidizing the top surface of the protective TiN to stuff grain boundaries in the TiN, then over the top of this structure forming the top conductor including a bottom barrier layer of TiN followed by an intervening layer of aluminum followed by a top barrier layer of TiN.

Figure 8:
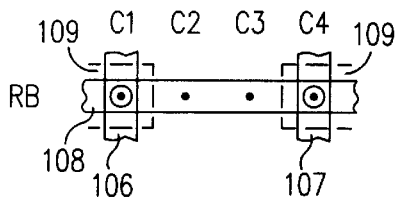

FIG. 8 (Prior Art) is a simplified top-down diagram of another conventional structure. There are two vertically extending column conductors 106 and 107 and one horizontally extending row conductor 108. There are antifuses at locations RB/C1 and RB/C4 but there are no antifuses at locations RB/C2 and RB/C3. As in the structure of FIG. 6, there are undesirable edges of the programmable material 109 underneath row conductor 108 between locations RB/C1 and RB/C4.

Figure 9:
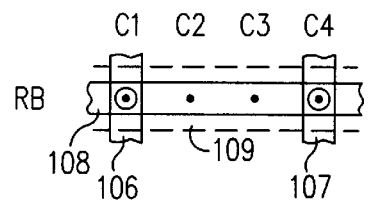

FIG. 9 is a simplified top-down diagram in accordance with an embodiment of the present invention. There is one common layer of programmable material 109 for both of the antifuses such that there is no edge or corner of the programmable material 109 under row conductor 108 between locations RB/C1 and RB/C4.

Figure 10:
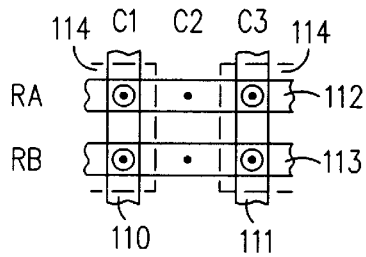

FIG. 10 (Prior Art) is a simplified top-down diagram of another conventional structure. There are two vertically extending column conductors 110 and 111 and two horizontally extending row conductors 112 and 113. There are antifuses at locations RA/C1, RA/C3, RB/C1 and RB/C3. There are no antifuses at locations RA/C2 and RB/C2. Again, there are undesirable edges of the programmable material 114 underneath row conductors 112 and 113.

Figure 11:
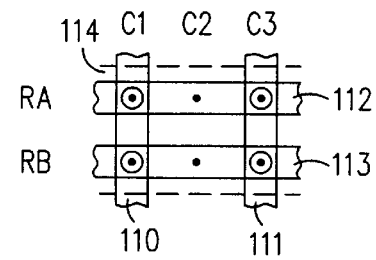

FIG. 11 is a simplified top-down diagram in accordance with an embodiment of the present invention. There is one common layer of programmable material 114 for all of the four antifuses such that there is no edge or corner of the programmable material 114 under either of row conductors 112 or 113.

Figure 12:
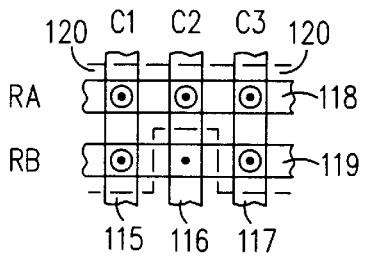

FIG. 12 (Prior Art) is a simplified top-down diagram of another conventional structure. There are three vertically extending column conductors 115, 116 and 117, two horizontally extending row conductors 118 and 119, and five antifuses at locations RA/C1, RA/C2, RA/C3, RB/C1 and RB/C3. There is no antifuses at location RB/C2. There are undesirable edges of the programmable material 120 underneath row conductor 119 where there is a cutout of the programmable material 120 in the vicinity of location RB/C2.

Figure 13:
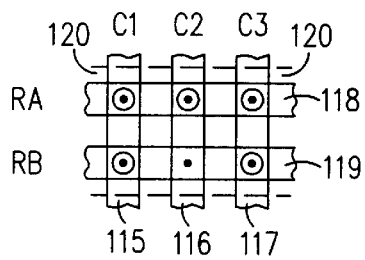

FIG. 13 is a simplified top-down diagram in accordance with an embodiment of the present invention. There is no edge or corner of programmable material 120 under row conductor 119 because the layer of programmable material is made to extend from location RB/C1 to location RB/C3 across location RB/C2.

Figure 14:
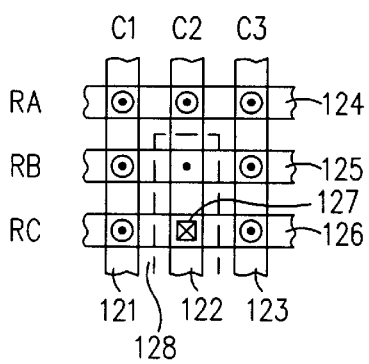

FIG. 14 (Prior Art) is a simplified top-down diagram of another conventional structure. There are three vertically extending column conductors 121, 122 and 123, three horizontally extending row conductors 124, 125 and 126, and seven antifuses at locations RA/C1, RA/C2, RA/C3, RB/C1, RB/C3, RC/C1 and RC/C3. There are no antifuses at locations RB/C2 or RC/C2. In this structure, there is a conductive via 127 at location RC/C2. Via 127 is a permanent connection from column conductor C2 to row conductor RC. It has the same basic structure as an antifuse except it has no programmable material, rather the top of its conductive plug is in permanent contact with overlaying row conductor 126. Such a via breaks the plane of the programmable material 128. In this illustration, the edge of the programmable material 128 is designated with a dashed line, the programmable material being disposed on the side of the dashed line opposite the via symbol. Note that there are undesirable edges of the programmable material 128 underneath row conductors 125 and 126.

Figure 15:
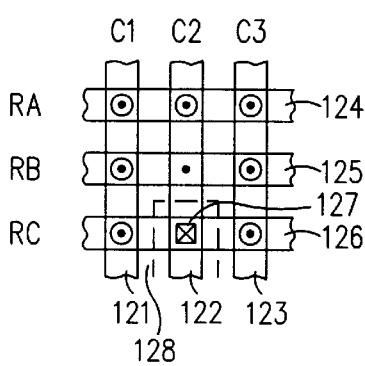

FIG. 15 is a simplified top-down diagram in accordance with an embodiment of the present invention. The undesirable edges of programmable material 128 under conductor 125 are eliminated by extending the layer of programmable material from location RB/C1 to location RB/C3 across location RB/C2. The undesirable edges underneath row conductor 126, however, are not removed due to the requirement that via 127 break the plane of the programmable material.

Figure 16:
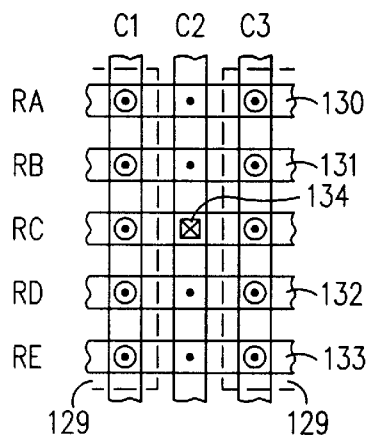

FIG. 16 (Prior Art) is a simplified top-down diagram of another conventional structure. The same symbols are used as are used in FIGS. 6–15. Note that the layer of programmable material 129 is in two parts and has edges underneath each of the horizontally extending row conductors.

Figure 17:
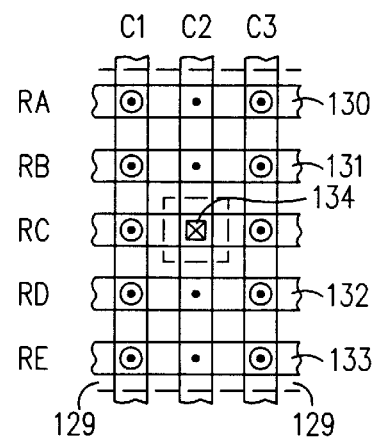

FIG. 17 is a simplified top-down diagram in accordance with an embodiment of the present invention. The undesirable edges of programmable material 129 under row conductors 130, 131, 132 and 133 are eliminated. An edge of the programmable material 129 forms a square such that there appears to be a square cutout in the programmable material layer around via 134.

Figure 18:
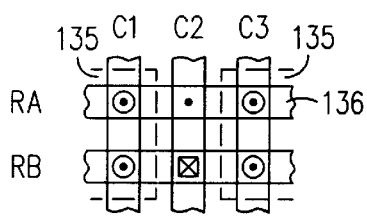

FIG. 18 (Prior Art) is a simplified top-down diagram of another conventional structure. The same symbols are used as are used in FIGS. 6–17. The layer of programmable material 135 again is in two parts and has edges underneath each of the horizontally extending row conductors.

Figure 19:
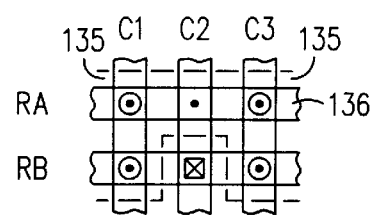

FIG. 19 is a simplified top-down diagram in accordance with an embodiment of the present invention. The undesirable edges of programmable material 135 under row conductor 136 is eliminated.

Figure 20:
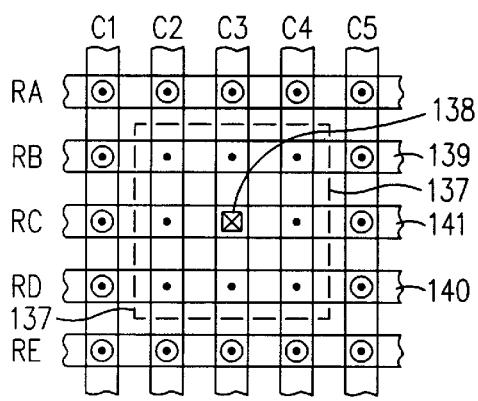

FIG. 20 (Prior Art) is a simplified top-down diagram of another conventional structure. The same symbols are used as are used in FIGS. 6–19. There is a ring of antifuses surrounding via 138. The layer of programmable material 137 for the antifuses therefore also surrounds via 138.

Figure 21:
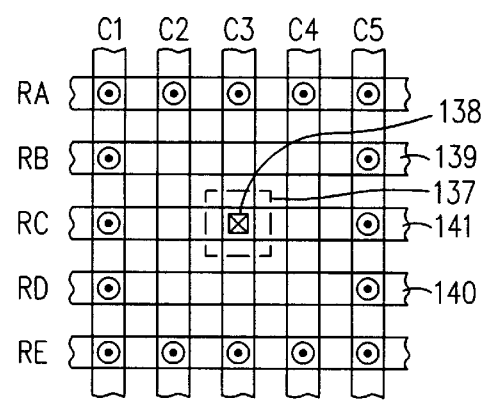

FIG. 21 is a simplified top-down diagram in accordance with an embodiment of the present invention. The undesirable edges of programmable material 137 under row conductors 139 and 140 are eliminated. Although extending the edge of the programmable material to the right to extend over location RC/C2 and extending the edge of the programmable material to the left to extend over location RC/C4 does not eliminate an edge under row conductor 141, it does move the two programmable material edges farther from the antifuses at locations RC/C1 and RC/C5. Due to the greater distance from the undesirable edge to the location of the antifuse conductive plug, the consequence of aluminum intrusion into the programmable material is minimized.

Accordingly, the programmable material layer of an FPGA employing antifuses is made to cover as much integrated circuit area in the vicinity of antifuses as possible (preferably substantially all of the integrated circuit area is covered, the only exception being due to conductors having to pass through the plane of the programmable material, such as vias that form permanent connections through the plane of the programmable material). The cutouts in the programmable material layer for vias in this embodiment may appear as squares when viewed from a top-down perspective. Alternatively, the programmable material does not cover the entire integrated circuit area but rather is made to extend everywhere the overlaying metal layer goes, the main exceptions being due to the necessity of vias making connections from the metal layer to underlying layers through the plane of the programmable material.

Figure 22:
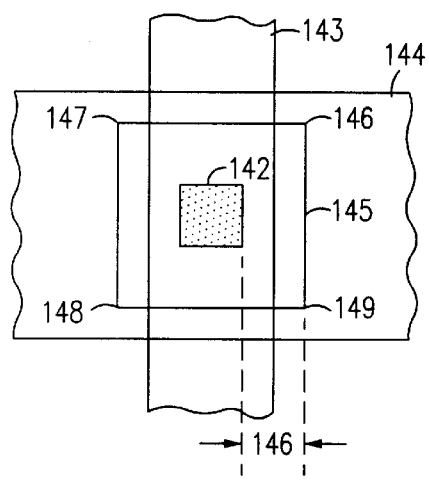

FIG. 22 (Prior Art) is a simplified top-down diagram of another conventional structure. An antifuse 142 can be programmable to couple conductor 143 to overlaying metal conductor 144. The edge of the programmable material of the antifuse appears as a square 145 when viewed from a top-down perspective. Distance 146 is the programmable material plug overlay design rule distance. Conductor 144 is a relatively wide low resistance conductor such as a "quad wire" conductor.

Figure 23:
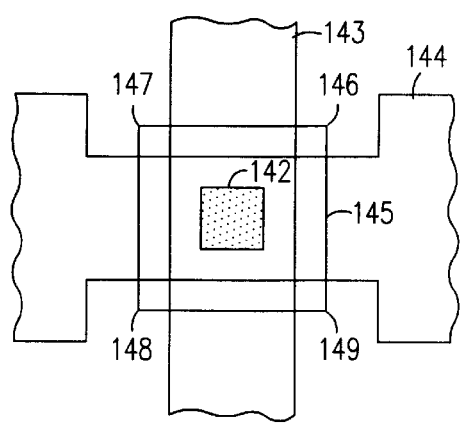

FIG. 23 is a simplified top-down diagram in accordance with an embodiment of the present invention. Conductor 144 is narrowed in the vicinity of antifuse 142 but is wider elsewhere to make the conductor a low resistance conductor. Not only are programmable material corners 146–149 not disposed underneath conductor 144, but also the length of the edge of programmable material 145 that is underneath conductor 144 is reduced.

Figure 24:
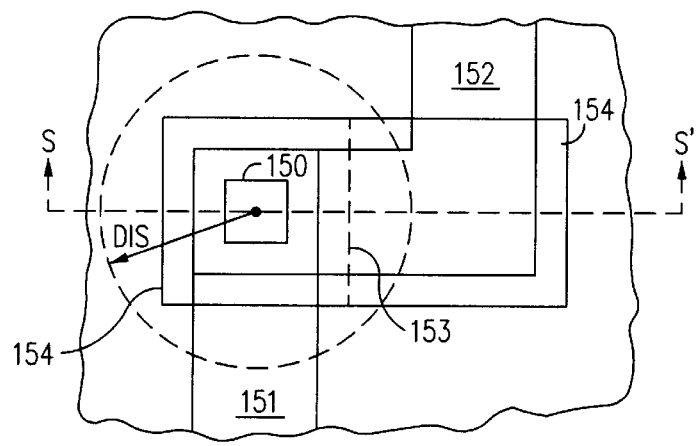
FIG. 24 is a top-down diagram of a structure in accordance with an embodiment of the present invention.
Figure 25:
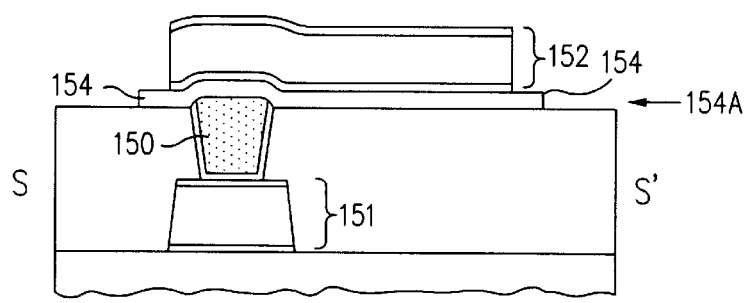
FIG. 25 is a cross-sectional diagram taken along sectional line SS' of the structure of FIG. 24.

FIG. 24 is a simplified top-down diagram in accordance with an embodiment of the present invention. FIG. 25 is a cross-sectional diagram taken along sectional line SS' of FIG. 24. In this example, there is one antifuse 150 for programmably coupling lower level metal conductor 151 to upper level metal conductor 152. Ordinary use of the programmable material plug overlay design rule in this example would generally result in a square, one of the sides of the square being designated with dashed line 153. This would, however, result in a programmable material edge 153 underneath conductor 152 within distance DIS of antifuse 150. In accordance with one embodiment of the present invention, the programmable material is made to extend to the right under conductor 152 in the direction of conductor 152 a lateral distance greater than lateral distance DIS. In the illustrated example, the programmable material 154 does not go everywhere metal conductor 152 goes, but in other examples it could go everywhere except for where a conductive via couples conductor 152 to a lower level through the plane of the programmable material.

It is to be understood that the antifuse structures of conventional FPGAs set forth in the figures and described in the associated text are illustrative of conventional antifuse structures, and are to be considered to be prior art structures, but that a particular conventional FPGA does not necessarily exist that contains the conventional structures exactly as illustrated. The figures of conventional FPGA antifuse structures are provided to facilitate understanding, consideration and examination of the prior art.

Although the invention is described in connection with certain specific embodiments for instructional purposes, the invention is not limited to the specific embodiments. Teachings of this disclosure relate to preventing failures in antifuses other than conductive plug-type antifuses due to edges and/or corners of the antifuse programmable material making a barrier metal layer susceptible to failure. Other types of antifuses, other conductor geometries and structures, and programmable materials other than amorphous silicon can be employed in accordance with the invention. Antifuses can be disposed between first layer metal and second layer metal, between second layer metal and third layer metal, between third layer metal and fourth layer metal, and/or between other layers of metal. In the process of laying out an FPGA, a design rule can be used that forbids a corner of the programmable material region of an antifuse from being disposed underneath a metal conductor in contact with the programmable material region. Accordingly, modifications, adaptations and combinations of various aspects of the described embodiments can be practiced without departing from the scope of the invention as set forth in the claims.

What is claimed is:

1. A method of forming a field programmable gate array having a plurality of logic modules, comprising:

forming a plurality of logic modules; and forming a plurality of conductive plug-type antifuses over the logic modules, each of the conductive plug-type antifuses having a region of amorphous silicon in contact with a conductive plug, less than three percent of all antifuses of the field programmable gate array comprising an amorphous silicon region having a corner (from the top-down perspective) disposed within a lateral distance DIS of the conductive plug of the antifuse, an antifuse of the field programmable gate array being separated from another antifuse of the field programmable gate array by lateral distance DIS, there being no antifuses of the field programmable gate array separated by a lateral distance smaller than lateral distance DIS.

2. A method of forming a field programmable gate array having a plurality of logic modules, comprising:

forming a plurality of logic modules; and forming a plurality of conductive plug-type antifuses over the logic modules, each of the conductive plug-type antifuses having a region of amorphous silicon in contact with a conductive plug, less than seventy-five percent of all antifuses of the field programmable gate array comprising an amorphous silicon region having an edge disposed within a lateral distance DIS of the conductive plug of the antifuse, an antifuse of the field programmable gate array being separated from another antifuse of the field programmable gate array by lateral distance DIS, there being no antifuses of the field programmable gate array separated by a lateral distance smaller than lateral distance DIS.

3. A method of forming a programmable integrated circuit having a plurality of locations oriented in rows and columns, the rows being designated RA, RB, RC . . . , the columns being designated C1, C2, C3 . . . , each of the locations being identified by a row designator and a column designator, the method comprising:

forming a first antifuse at location RB/C1 and a second antifuse at location RB/CX, where X is an integer greater than 2, no antifuse is formed at location RB/CY, where Y is an integer greater than 1 and less than X;

forming a row conductor extending from location RB/C1 to RB/CX; and forming a programmable material substantially in a plane, the programmable material formed underneath the row conductor and extending from location RB/C1 to RB/CX, the first antifuse being programmable to form an electrical connection through the programmable material at or near location RB/C1, the second antifuse being programmable to form an electrical connection through the programmable material at or near location RB/CX, no conductor is formed breaking the plane at any location between the first and second antifuses.

4. The method of claim 3, further comprising:

forming an insulation layer underneath the plane of the programmable material with a first opening and a second opening;

wherein forming the first antifuse comprises:

forming a first plug of conductive material in the first opening, the first plug having an upper surface in contact with a bottom surface of the programmable material at location RB/C1;

wherein forming the second antifuse comprises:

forming a second plug of conductive material in the second opening, the second plug having an upper surface in contact with a bottom surface of the programmable material at location RB/CX.

5. The method of claim 3, wherein forming a programmable material comprises depositing a layer of amorphous silicon.

6. The method of claim 3, further comprising:

forming a first column conductor extending from location RB/C1 to RA/C1, the first column conductor being formed underneath the plane of the programmable material; and forming a second column conductor extending from location RB/CX to RA/CX, the second column conductor being formed underneath the plane of the programmable material.

7. The method of claim 3, further comprising:

forming a plurality of antifuses, a respective one of the plurality of antifuses formed at each respective one of locations RA/C1 . . . RA/CX; and forming a second row conductor extending from location RA/C1 to RA/CX, wherein the programmable material is formed underneath the second row conductor and extending from location RA/C1 to RA/CX.

8. The method of claim 3, wherein X is 3, the method further comprising:

forming a third antifuse at location RC/C1;

forming a fourth antifuse at location RC/C3;

forming a second row conductor extending from location RC/C1 to RC/C3; and forming a conductive via disposed at location RC/C2, the conductive via breaking the plane of the programmable material.

9. The method of claim 8, further comprising:

forming a column conductor extending from location RA/C2 to RC/C2, the column conductor formed underneath the plane of the programmable material, the second row conductor formed over the plane of the programmable material, the conductive via connecting the column conductor and the second row conductor.

10. The method of claim 3, further comprising:

forming a third antifuse at location RA/C1 and a fourth antifuse at location RA/CX; and forming a second row conductor extending from location RA/C1 to RA/CX, wherein there is no conductor break ing the plane of the programmable material at any location between the third and fourth antifuses.

11. The method of claim 3, wherein there are no antifuses formed at locations RC/C1 through RC/CX.

12. The method of claim 3, wherein the programmable integrated circuit is a field programmable gate array.

* * * * *